(12) United States Patent
Chiang et al.

(10) Patent No.: US 10,314,190 B2
(45) Date of Patent: Jun. 4, 2019

(54) POWER ADAPTING BOX AND FAN MODULE

(71) Applicants: Inventec (Pudong) Technology Corp., Shanghai (CN); Inventec Corporation, Taipei (TW)

(72) Inventors: Chih-Wei Chiang, Taipei (TW); Yuan-Chang Yang, Taipei (TW); Shih-Wei Chen, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 158 days.

(21) Appl. No.: 15/470,882

(22) Filed: Mar. 27, 2017

(65) Prior Publication Data

US 2018/0116064 A1 Apr. 26, 2018

(30) Foreign Application Priority Data

Oct. 20, 2016 (CN) .......................... 2016 1 0914678

(51) Int. Cl.

| H05K 7/02 | (2006.01) |
|---|---|
| F04D 29/40 | (2006.01) |
| H01R 25/00 | (2006.01) |
| H05K 5/02 | (2006.01) |
| H05K 7/10 | (2006.01) |
| H05K 7/20 | (2006.01) |
| F04D 25/06 | (2006.01) |
| F04D 25/16 | (2006.01) |
| F04D 29/54 | (2006.01) |
| F04D 29/64 | (2006.01) |

(52) U.S. Cl.
CPC ......... H05K 7/026 (2013.01); F04D 25/0693 (2013.01); F04D 25/166 (2013.01); F04D 29/403 (2013.01); F04D 29/544 (2013.01); F04D 29/646 (2013.01); H01R 25/006 (2013.01); H05K 5/0247 (2013.01); H05K 7/10 (2013.01); H05K 7/20172 (2013.01); H05K 7/20727 (2013.01); H05K 7/20736 (2013.01); *F05D 2230/51* (2013.01)

(58) Field of Classification Search
CPC .... F04D 29/544; F04D 29/646; F04D 29/403; F04D 25/0693; F04D 25/166; H05K 7/026; H05K 7/20727; H05K 7/20172; H05K 7/10; H05K 7/202; H05K 7/20736; H05K 5/0247; H01R 25/006; H01R 9/2408; H01R 9/2491; H01R 13/514; F05D 2230/51
USPC ................. 417/360, 423.5, 423.15; 361/695; 165/80.1–80.3
See application file for complete search history.

(56) References Cited

U.S. PATENT DOCUMENTS

| 4,059,328 A * | 11/1977 | Rigo ........................ H02B 1/42 174/53 |
| 6,236,564 B1 * | 5/2001 | Fan ........................ F04D 25/12 165/80.3 |

(Continued)

*Primary Examiner* — Charles G Freay
(74) *Attorney, Agent, or Firm* — Winston Hsu

(57) ABSTRACT

A power adapting box and a fan module are provided. The power adapting box includes a box body, a plurality of first power adapters, an expansion socket and a plurality of second power adapters. The first power adapters are disposed in the box body. The expansion socket is detachably disposed in the box body. The second power adapters are disposed in the expansion socket.

12 Claims, 7 Drawing Sheets

(56) References Cited

U.S. PATENT DOCUMENTS

| | | | | |
|---|---|---|---|---|
| 6,547,588 B1* | 4/2003 | Hsu | ............ | H01R 13/518 |
| | | | | 439/532 |
| 6,961,248 B2* | 11/2005 | Vincent | ............ | H05K 7/20172 |
| | | | | 361/679.46 |
| 9,147,982 B2* | 9/2015 | Smed | ............ | H01R 9/2408 |
| 9,265,175 B2* | 2/2016 | Yoshida | ............ | H05K 7/20172 |
| 2007/0109710 A1* | 5/2007 | Milan | ............ | H01R 9/2408 |
| | | | | 361/118 |
| 2013/0100613 A1* | 4/2013 | Nakai | ............ | H05K 7/20563 |
| | | | | 361/695 |
| 2016/0286675 A1* | 9/2016 | Bury | ............ | H05K 7/1474 |

* cited by examiner

POWER ADAPTING BOX AND FAN MODULE

BACKGROUND OF THE INVENTION

1. Field of the Invention

The invention relates to a power adapting box and a fan module and, more particularly, to a power adapting box having an expansion socket and a fan module equipped with the power adapting box.

2. Description of the Prior Art

An information technology (IT) room in many enterprises, government units or service providers nowadays always disposes various servers, such as computing server, storage server, network server, and so on. In general, when the server is operating, the server may generate a large amount of heat. If the heat is accumulated in the electronic components of the server without dissipating immediately, the electronic components may get damage due to the accumulated heat. Accordingly, the server is usually equipped with a plurality of fans for dissipating heat. In the prior art, the fans are disposed in a casing and a power adapting box is disposed on a bottom of the casing, such that the fan power is connected to a main board through the power adapting box.

In general, the power adapting box comprises a box body and eight power adapters. The eight power adapters are fixed in the box body. In other words, the eight power adapters have to be assembled in the power adapting box during manufacture. However, once the number of fans disposed in the server is fewer than eight, one or more than one power adapters will be idle. Since the number of power adapters disposed in the power adapting box cannot be adjusted according to practical applications, the power adapting box of the prior art is not flexible in use and the manufacture cost may increase.

SUMMARY OF THE INVENTION

The invention provides a power adapting box having an expansion socket and a fan module equipped with the power adapting box, so as to solve the aforesaid problems.

According to an embodiment of the invention, a power adapting box comprises a box body, a plurality of first power adapters, an expansion socket and a plurality of second power adapters. The first power adapters are disposed in the box body. The expansion socket is detachably disposed in the box body. The second power adapters are disposed in the expansion socket.

According to another embodiment of the invention, a fan module comprises a casing, a plurality of fans and a power adapting box. The fans are disposed in the casing. The power adapting box is disposed on a side of the casing. The power adapting box comprises a box body, a plurality of first power adapters, an expansion socket and a plurality of second power adapters. The first power adapters are disposed in the box body. The expansion socket is detachably disposed in the box body. The second power adapters are disposed in the expansion socket.

As mentioned in the above, since the expansion socket of the invention is detachably disposed in the box body, a user can detach the expansion socket from the box body when the number of power adapters disposed in the box body is enough. On the other hand, the user can dispose the expansion socket in the box body when the number of power adapters disposed in the box body is not enough, so as to expand the number of power adapters. Accordingly, the power adapting box of the invention will be more flexible in use.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
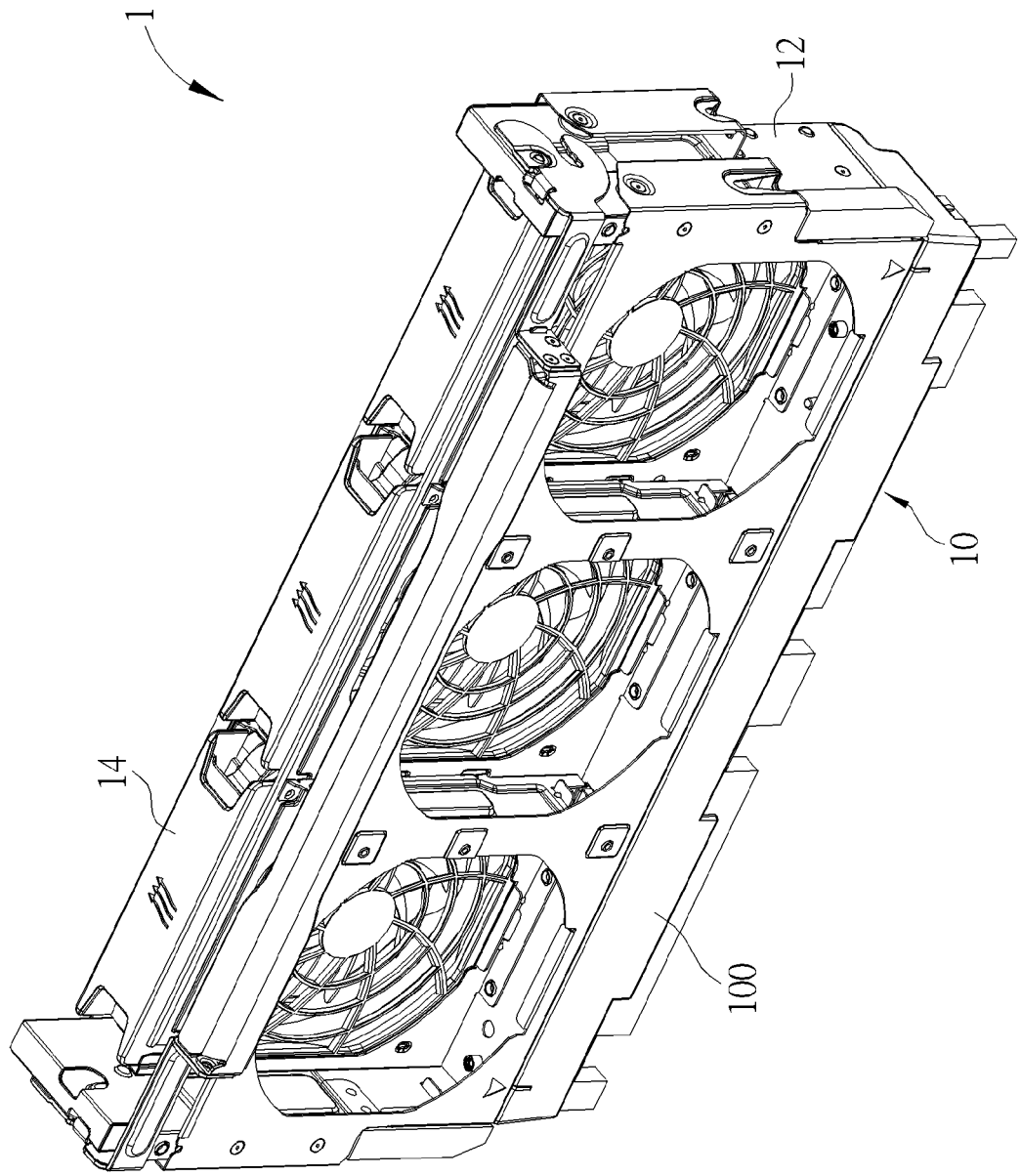
FIG. 1 is a perspective view illustrating a fan module according to an embodiment of the invention.
Figure 2:
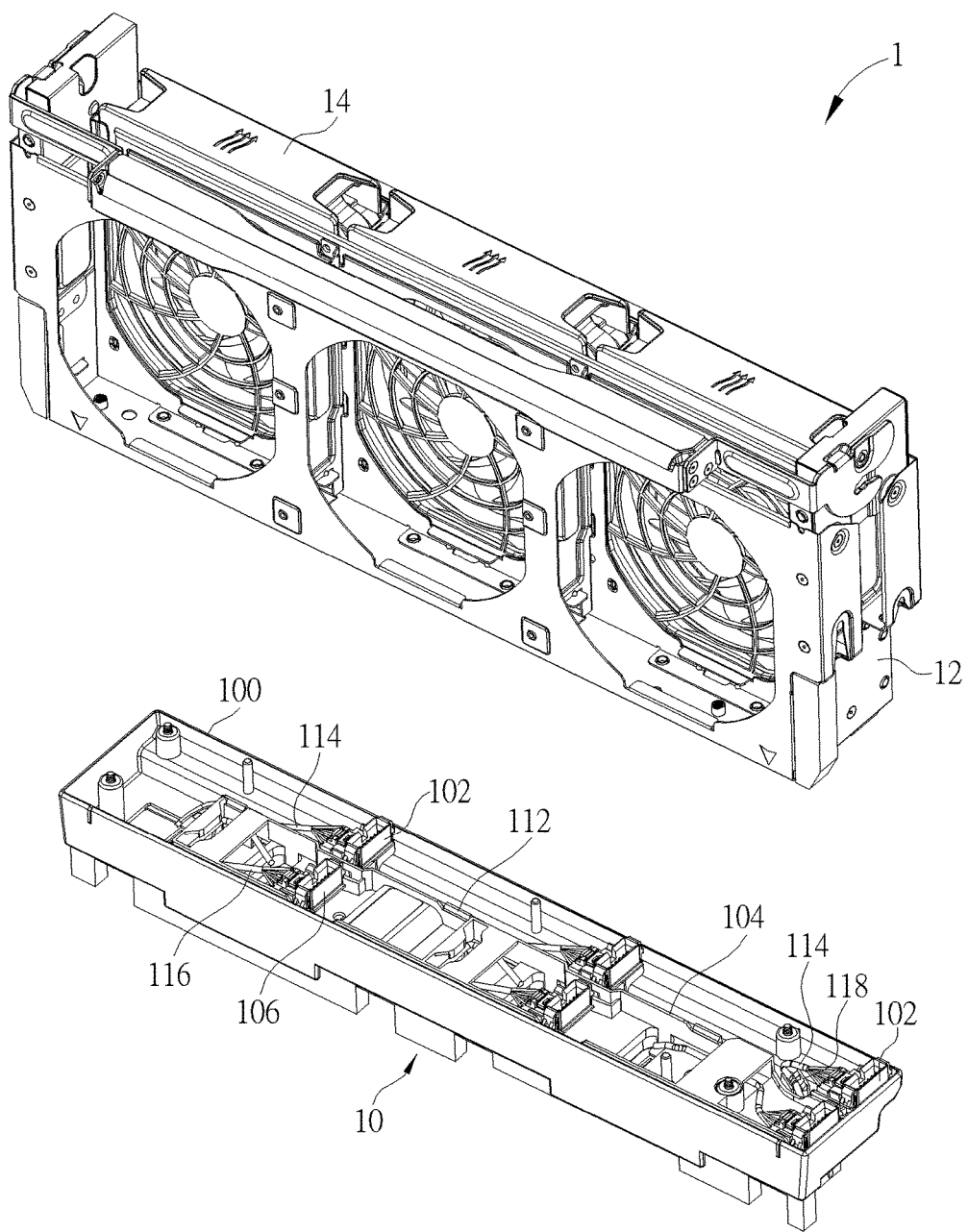
FIG. 2 is an exploded view illustrating the fan module shown in FIG. 1.
Figure 3:
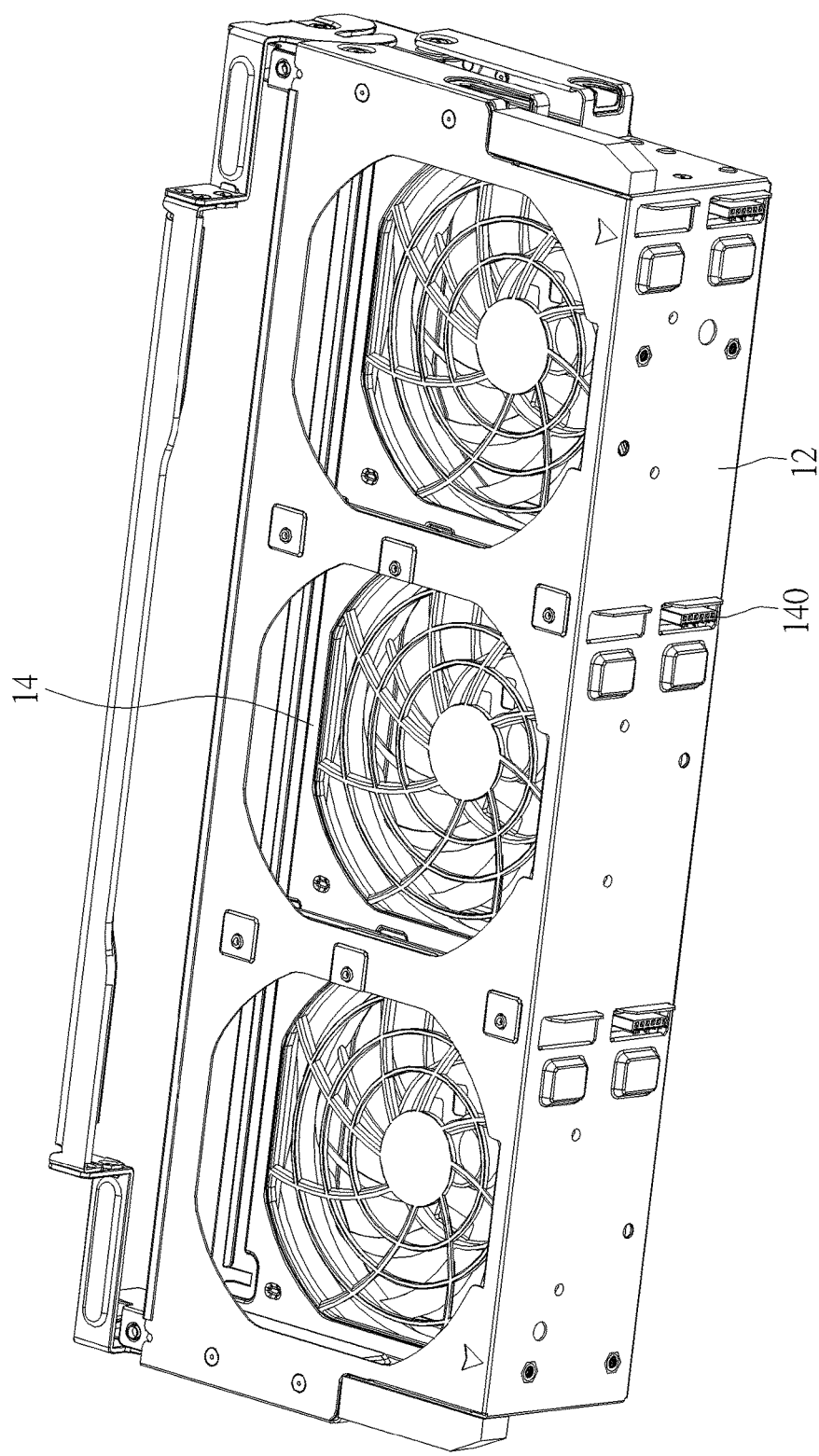
FIG. 3 is a perspective view illustrating the casing and the fans shown in FIG. 2 from another viewing angle.
Figure 4:
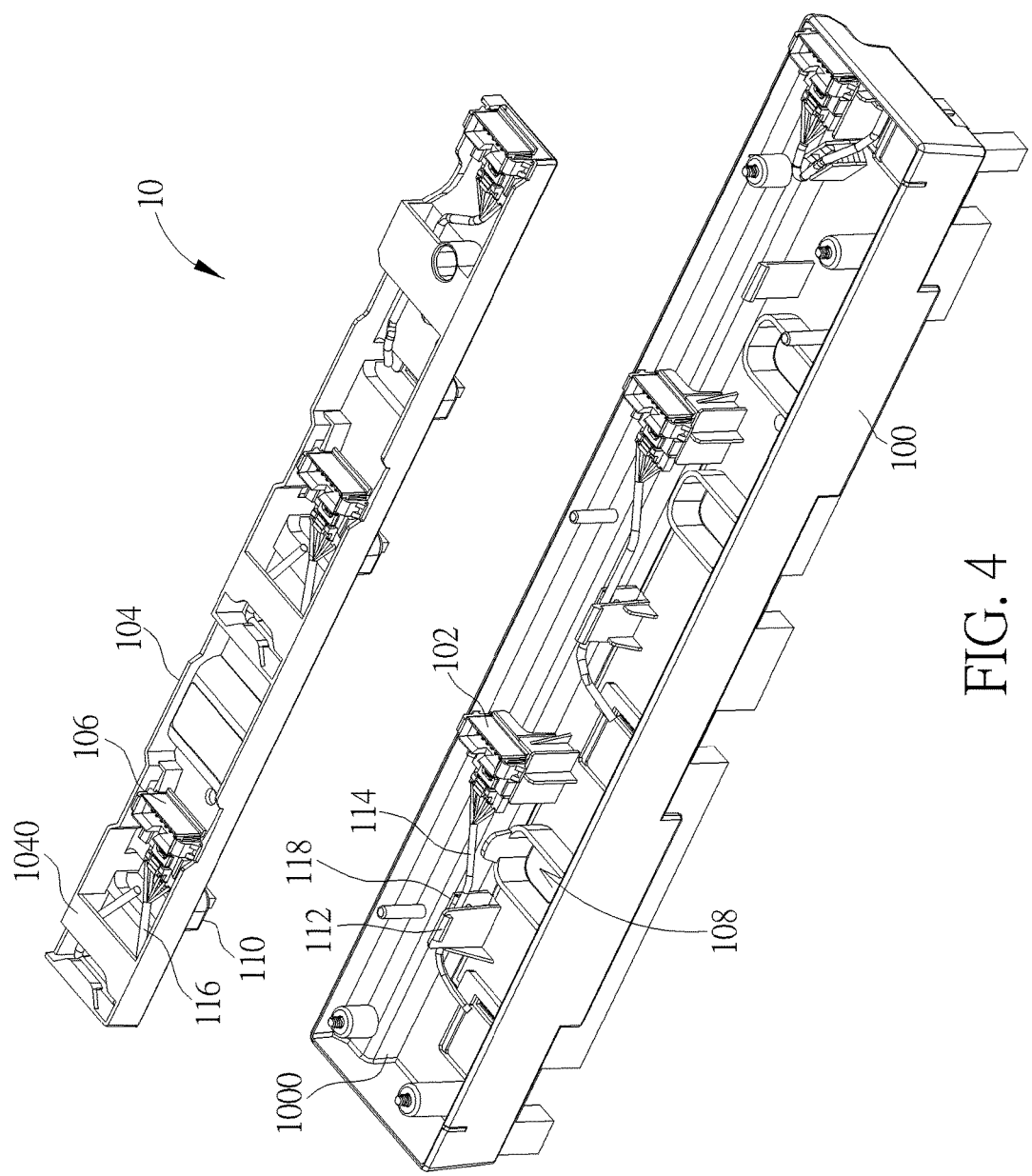
FIG. 4 is an exploded view illustrating the power adapting box shown in FIG. 2.
Figure 5:
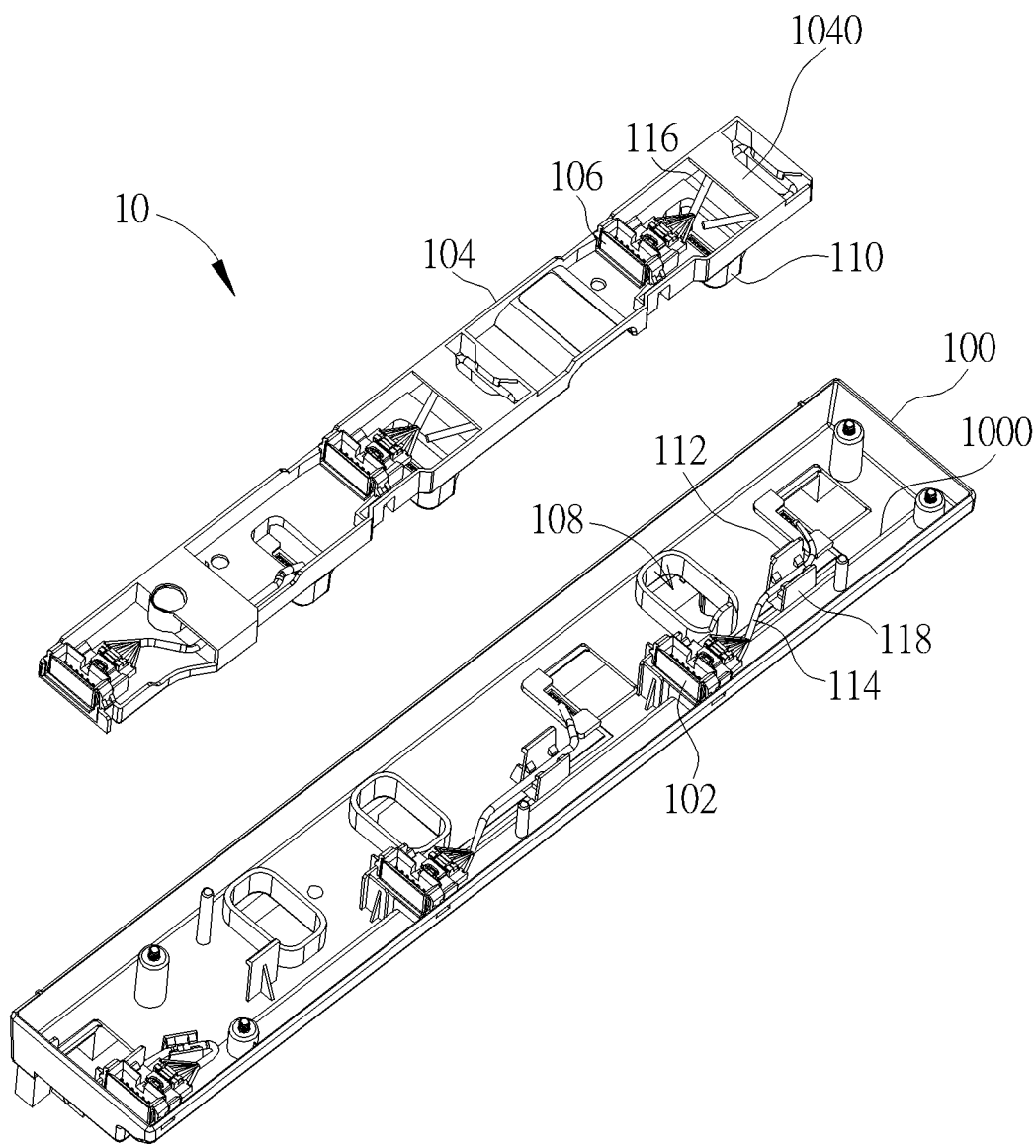
FIG. 5 is an exploded view illustrating the power adapting box shown in FIG. 2 from another viewing angle.
Figure 6:
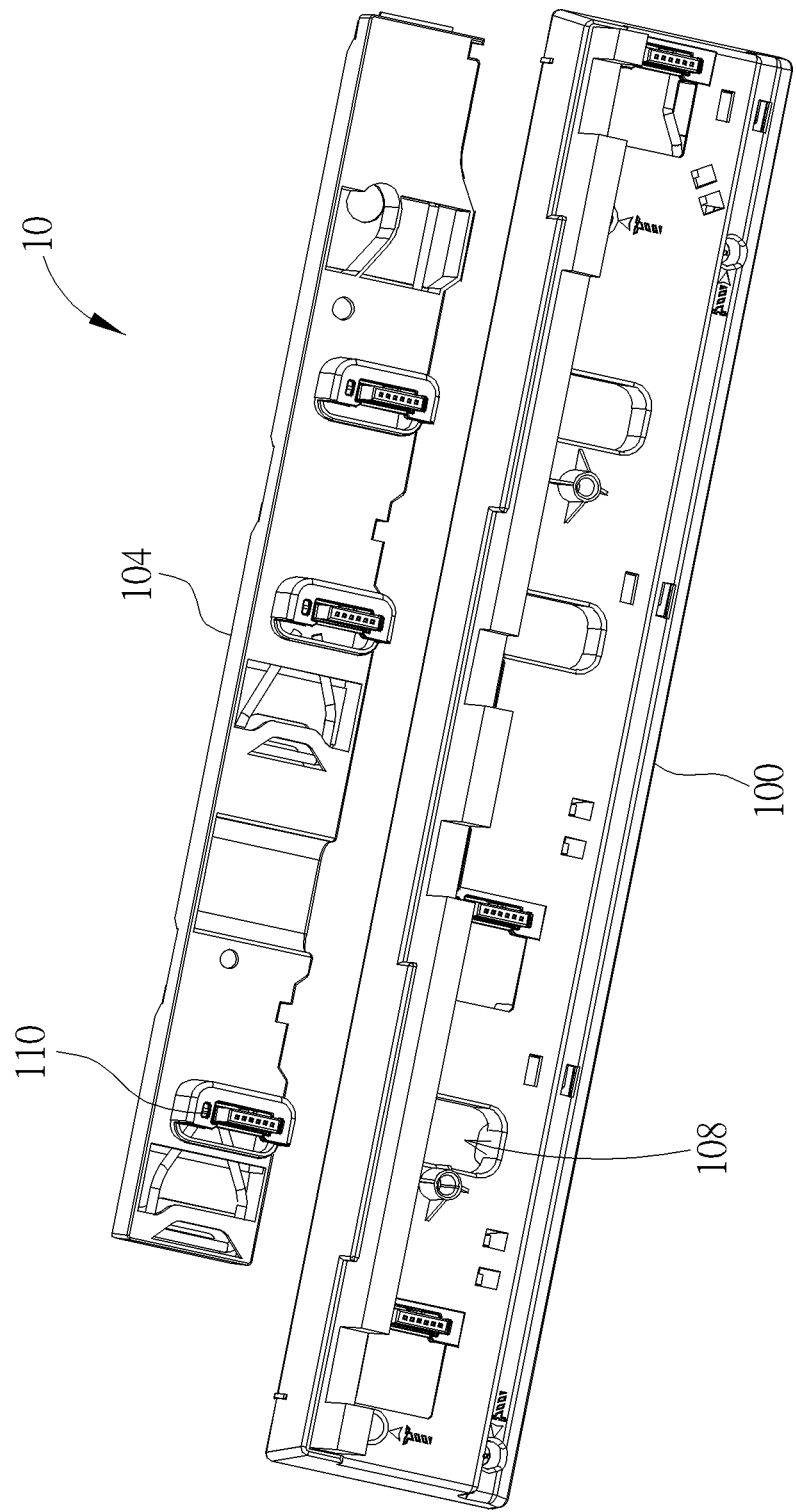
FIG. 6 is an exploded view illustrating the power adapting box shown in FIG. 2 from another viewing angle.
Figure 7:
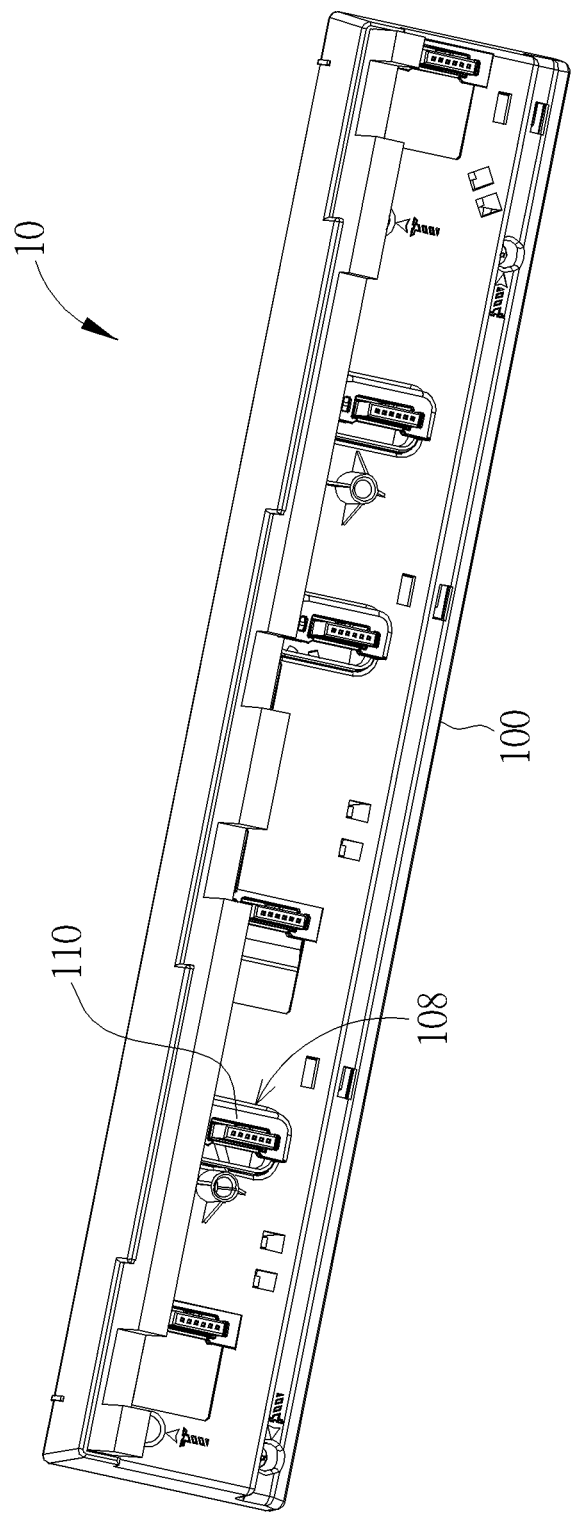
FIG. 7 is a perspective view illustrating the power adapting box shown in FIG. 2 from another viewing angle.

Referring to FIGS. 1 to 7, FIG. 1 is a perspective view illustrating a fan module 1 according to an embodiment of the invention, FIG. 2 is an exploded view illustrating the fan module 1 shown in FIG. 1, FIG. 3 is a perspective view illustrating the casing 12 and the fans 14 shown in FIG. 2 from another viewing angle, FIG. 4 is an exploded view illustrating the power adapting box 10 shown in FIG. 2, FIG. 5 is an exploded view illustrating the power adapting box 10 shown in FIG. 2 from another viewing angle, FIG. 6 is an exploded view illustrating the power adapting box 10 shown in FIG. 2 from another viewing angle, and FIG. 7 is a perspective view illustrating the power adapting box 10 shown in FIG. 2 from another viewing angle.

As shown in FIG. 1, the fan module 1 comprises a power adapting box 10, a casing 12 and a plurality of fans 14. In practical applications, the fan module 1 may be disposed in a server, a computer or other electronic devices, so as to use the fans 14 to dissipate heat. The fans 14 are disposed in the casing 12 and the power adapting box 10 is disposed on a side of the casing 12. The power adapting box 10 is used for connecting the power of the fans 14 to a main board (not shown) of a server, a computer or other electronic devices. It should be noted that the number of fans 14 can be determined according to practical applications, so the invention is not limited to the embodiment shown in FIG. 1.

As shown in FIGS. 2 and 4, the power adapting box 10 comprises a box body 100, a plurality of first power adapters 102, an expansion socket 104 and a plurality of second power adapters 106. The first power adapters 102 are disposed in the box body 100. The expansion socket 104 is detachably disposed in the box body 100. The second power adapters 106 are disposed in the expansion socket 104. It should be noted that the number of first power adapters 102 and the number of second power adapters 106 can be determined according to practical applications, so the invention is not limited to the embodiment shown in FIGS. 2 and 4. The first power adapters 102 and the second power adapters 106 are used for connecting a connector 140 of the fan 14, so as to connect the power of the fan 14 to a main board (not shown) of a server, a computer or other electronic devices.

As shown in FIGS. 4 to 7, the box body 100 has a plurality of positioning holes 108 and the expansion socket 104 has a plurality of positioning pillars 110, wherein the number of positioning holes 108 is corresponding to the number of positioning pillars 110. When the expansion socket 104 is disposed in the box body 100, each of the positioning pillars 110 is inserted into one of the positioning holes 108. Accordingly, the box body 100 and the expansion socket 104 can be positioned with respect to each other during assembly through the positioning holes 108 and the positioning pillars 110.

Furthermore, the box body 100 may have a plurality of first engaging hooks 112. When the expansion socket 104 is disposed in the box body 100, the first engaging hooks 112 are engaged with a side wall of the expansion socket 104, so as to fix the expansion socket 104 in the box body 100. In this embodiment, the first engaging hooks 112 may be resilient cantilever arms extending from a bottom of the box body 100. A user needs to push the first engaging hooks 112 to disengage the first engaging hooks 112 from the side wall of the expansion socket 104 and then the user can detach the expansion socket 104 from the box body 100. In practical applications, the first engaging hook 112 may essentially consist of a plate and a protrusion protruded from an end of the plate.

Therefore, a user can detach the expansion socket 104 from the box body 100 when the number of first power adapters 102 disposed in the box body 100 is enough. On the other hand, the user can dispose the expansion socket 104 in the box body 100 when the number of first power adapters 102 disposed in the box body 100 is not enough (i.e. the number of fans needed to be installed increases), so as to expand the number of power adapters. Accordingly, the power adapting box 10 will be more flexible in use.

In this embodiment, each of the first power adapters 102 has a box body connecting wire 114 and each of the second power adapters 106 has an expansion socket connecting wire 116. In this embodiment, a length of the box body connecting wire 114 may be identical to a length of the expansion socket connecting wire 116, so as to save cost of manufacturing the wires with different lengths. However, in another embodiment, the length of the box body connecting wire 114 may be different from the length of the expansion socket connecting wire 116 according to practical applications.

In this embodiment, the box body 100 may have a plurality of second engaging hooks 118. The second engaging hook 118 is used for clamping and fixing the box body connecting wire 114 of the first power adapter 102. According to the arrangement of the box body connecting wires 114, at least one of the second engaging hooks 118 may be located between the first engaging hook 112 and a side wall 1000 of the box body 100. In other words, the invention may hide at least parts of the box body connecting wires 114 of the first power adapters 102 between the first engaging hook 112 and the side wall 1000 of the box body 100, so as to prevent the box body connecting wire 114 of the first power adapter 102 from interfering with the expansion socket 104.

Moreover, the expansion socket 104 may have a plurality of restraining portions 1040. The restraining portion 1040 can restrain the expansion socket connecting wire 116 of the second power adapter 106 in the expansion socket 104, such that the expansion socket connecting wire 116 of the second power adapter 106 can be accommodated in the expansion socket 104 tidily.

As mentioned in the above, since the expansion socket of the invention is detachably disposed in the box body, a user can detach the expansion socket from the box body when the number of power adapters disposed in the box body is enough. On the other hand, the user can dispose the expansion socket in the box body when the number of power adapters disposed in the box body is not enough, so as to expand the number of power adapters. Accordingly, the power adapting box of the invention will be more flexible in use.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power adapting box comprising:
  a box body;
  a plurality of first power adapters disposed in the box body;
  an expansion socket detachably disposed in the box body; and
  a plurality of second power adapters disposed in the expansion socket;
  wherein the expansion socket has a plurality of restraining portions, each of the second power adapters has an expansion socket connecting wire and one of the plurality of restraining portions, and the restraining portion restrains the corresponding expansion socket connecting wire in the expansion socket.

2. The power adapting box of claim 1, wherein the box body has a plurality of positioning holes, the expansion socket has a plurality of positioning pillars, and each of the positioning pillars is inserted into one of the positioning holes when the expansion socket is disposed in the box body.

3. The power adapting box of claim 1, wherein the box body has a plurality of first engaging hooks and the first engaging hooks are engaged with the expansion socket when the expansion socket is disposed in the box body.

4. The power adapting box of claim 3, wherein the box body has a plurality of second engaging hooks, each of the first power adapters has a box body connecting wire, and each second engaging hook clamps and fixes the corresponding box body connecting wire.

5. The power adapting box of claim 4, wherein at least one of the second engaging hooks is located between the first engaging hook and a side wall of the box body.

6. The power adapting box of claim 1, wherein each of the first power adapters has a box body connecting wire, there are the same number of wires for the box body and the expansion socket, and a length of the box body connecting wire is identical to a length of the expansion socket connecting wire correspondingly.

7. A fan module comprising:
  a casing;
  a plurality of fans disposed in the casing; and
  a power adapting box comprising:
    a box body;
    a plurality of first power adapters disposed in the box body;
    an expansion socket detachably disposed in the box body; and a plurality of second power adapters disposed in the expansion socket;

wherein the expansion socket has a plurality of restraining portions, each of the second power adapters has an expansion socket connecting wire and one of the plurality of restraining portions, and the restraining portion restrains the corresponding expansion socket connecting wire in the expansion socket.

8. The fan module of claim 7, wherein the box body has a plurality of positioning holes, the expansion socket has a plurality of positioning pillars, and each of the positioning pillars is inserted into one of the positioning holes when the expansion socket is disposed in the box body.

9. The fan module of claim 7, wherein the box body has a plurality of first engaging hooks and the first engaging hooks are engaged with the expansion socket when the expansion socket is disposed in the box body.

10. The fan module of claim 9, wherein the box body has a plurality of second engaging hooks, each of the first power adapters has a box body connecting wire, and each second engaging hook clamps and fixes the corresponding box body connecting wire.

11. The fan module of claim 10, wherein at least one of the second engaging hooks is located between the first engaging hook and a side wall of the box body.

12. The fan module of claim 7, wherein each of the first power adapters has a box body connecting wire, there are the same number of wires for the box body and the expansion socket, and a length of the box body connecting wire is identical to a length of the expansion socket connecting wire correspondingly.

\* \* \* \* \*